(12) United States Patent
Shen

(10) Patent No.: US 10,393,507 B2
(45) Date of Patent: Aug. 27, 2019

(54) INTERFEROMETER MEASUREMENT DEVICE AND CONTROL METHOD THEREFOR

(71) Applicant: SHANGHAI MICRO ELECTRONICS EQUIPMENT (GROUP) CO., LTD., Shanghai (CN)

(72) Inventor: Xin Shen, Shanghai (CN)

(73) Assignee: SHANGHAI MICRO ELECTRONICS EQUIPMENT (GROUP) CO., LTD., Shanghai (CN)

(*) Notice: Subject to any disclaimer, the term of this patent is extended or adjusted under 35 U.S.C. 154(b) by 0 days.

(21) Appl. No.: 16/067,328

(22) PCT Filed: Dec. 28, 2016

(86) PCT No.: PCT/CN2016/112643
§ 371 (c)(1),
(2) Date: Jun. 29, 2018

(87) PCT Pub. No.: WO2017/114415
PCT Pub. Date: Jul. 6, 2017

(65) Prior Publication Data
US 2019/0033057 A1 Jan. 31, 2019

(30) Foreign Application Priority Data
Dec. 31, 2015 (CN) .......................... 2015 1 1031860

(51) Int. Cl.
*G01B 9/02* (2006.01)
*G01B 11/02* (2006.01)
(Continued)

(52) U.S. Cl.
CPC ............ *G01B 11/02* (2013.01); *G01B 5/0004* (2013.01); *G01B 9/02016* (2013.01);
(Continued)

(58) Field of Classification Search
CPC ...... G01B 11/02; G01B 9/02; G01B 9/02049; G01B 9/02027
See application file for complete search history.

(56) References Cited

U.S. PATENT DOCUMENTS

| | | |
|---|---|---|
| 4,280,054 A | 7/1981 | Guarino |
| 5,523,841 A * | 6/1996 | Nara .................. G01B 11/002 356/500 |

(Continued)

FOREIGN PATENT DOCUMENTS

| | | |
|---|---|---|
| CN | 1617048 A | 5/2005 |
| CN | 102564303 A | 7/2012 |

(Continued)

*Primary Examiner* — Jonathan M Hansen
(74) *Attorney, Agent, or Firm* — Muncy, Geissler, Olds & Lowe, P.C.

(57) ABSTRACT

An interferometer measuring device is disclosed which includes a workpiece stage (10), a laser interferometer (20) and a measuring reflector (30) mounted on the workpiece stage. The measuring reflector (30) is comprised of a plurality of planar mirrors (31) that are joined together along a horizontal direction. The laser interferometer (20) includes a first interferometer (21) and a second interferometer (22). The first interferometer (21) and the second interferometer (22) are configured such that during a horizontal movement of the workpiece stage (10) with respect to the laser interferometer (20), when light beams emanated from the first interferometer (21) and the second interferometer (22) are incident on a transition section (32) defined by corresponding adjacent two of the planar mirrors (31), the light beam emanated from the first interferometer (21) is incident on one of the adjacent two planar mirrors (31) and the light beam emanated from the second interferometer (22) is incident on the other of the adjacent two planar mirrors (31). Additionally, the first interferometer (21) and the second interferometer (22) alternately provide positional informa- (Continued)

tion to the workpiece stage (10). A method for controlling such an interferometer measuring device is also disclosed. The interferometer measuring device and the method enable an extended horizontal measurement range for the workpiece stage (10) by using the plurality of planar mirrors (31) that are joined together as well as by alternating zero-reference updating of the two interferometers (21, 22).

8 Claims, 5 Drawing Sheets

(51) Int. Cl.
*G01B 5/00* (2006.01)
*G01B 11/00* (2006.01)
*G03F 7/20* (2006.01)

(52) U.S. Cl.
CPC ..... *G01B 9/02027* (2013.01); *G01B 9/02075* (2013.01); *G01B 11/002* (2013.01); *G01B 11/026* (2013.01); *G03F 7/70716* (2013.01)

(56) References Cited

U.S. PATENT DOCUMENTS

| | | |
|---|---|---|
| 5,757,160 A | 5/1998 | Kreuzer |
| 2005/0259268 A1* | 11/2005 | Schluchter .......... G03F 7/70775 356/500 |
| 2006/0170892 A1* | 8/2006 | Koenen .................. B23D 43/04 355/55 |

FOREIGN PATENT DOCUMENTS

| | | |
|---|---|---|
| CN | 102809346 A | 12/2012 |
| CN | 103376665 A | 10/2013 |
| CN | 103383271 A | 11/2013 |
| CN | 104545470 A | 4/2015 |
| EP | 2815278 A2 | 12/2014 |
| WO | WO 2013120927 A2 | 8/2013 |

\* cited by examiner

INTERFEROMETER MEASUREMENT DEVICE AND CONTROL METHOD THEREFOR

TECHNICAL FIELD

The present invention relates to optical electromechanical devices and, in particular, to an interferometer measuring device and a method for control thereof.

BACKGROUND

In an interferometer-based measurement system of a traditional photolithography machine, a laser interferometer is often used to precisely measure the position and rotation of a workpiece stage or wafer stage (collectively referred to as "workpiece stage"). Referring to FIG. 1, in order to measure a workpiece stage 1 of a photolithography machine in a horizontal X- or Y-direction (here, a coordinate system is defined by a vertical Z-axis and the horizontal X- and Y-directions), an elongated reflector 2 is usually mounted on a side face of the workpiece stage 1. The light emanated from a laser interferometer 3 is vertically incident on the elongated reflector 2 to measure X and Y coordinates of the workpiece stage. In general cases, the workpiece stage 1 will not travel a long distance in the vertical direction but may travel a long horizontal distance. Therefore, in order to achieve the measurement of the X and Y coordinates of the workpiece stage 1 undergoing a large stroke, it is necessary for the elongated reflector 2 to have a length comparable to that of the stoke. For this reason, in the traditional photolithography machine equipped with such an interferometer-based measurement system, the horizontal stroke of the workpiece stage 1 is generally limited by the length of the elongated reflector 2, and a longer stroke of the workpiece stage 1 requires an increase in the length of the elongated reflector 2, which, however, tends to add processing difficulties and raise the manufacturing cost.

Therefore, there is an urgent need in the art for an interferometer measuring device and a method for controlling it, which can extend the measurement range for the workpiece stage without increasing the length of the elongated reflector.

SUMMARY OF THE INVENTION

In order to overcome the above problem of an excessively long elongated reflector that may add processing difficulties and raise the manufacturing cost, the present invention provides an interferometer measuring device and a method for controlling the interferometer measuring device.

To solve the problem, the interferometer measuring device provided in the present invention includes a workpiece stage, a laser interferometer and a measuring reflector mounted on the workpiece stage. The measuring reflector is comprised of a plurality of planar mirrors that are joined together along a horizontal direction, and wherein the laser interferometer includes a first interferometer and a second interferometer, which are configured such that, during a movement of the workpiece stage with respect to the laser interferometer along the horizontal direction, when light beams emanated from the first interferometer and the second interferometer are incident on a transition section defined by corresponding adjacent two of the plurality of planar mirrors, the light beam emanated from the first interferometer is incident on one of the adjacent two planar mirrors with the light beam emanated from the second interferometer being incident on the other one of the adjacent two planar mirrors, and the first interferometer and the second interferometer alternately provide positional information to the workpiece stage.

Preferably, the measuring reflector may be comprised of a plurality of rectangular planar mirrors that are joined together along the horizontal direction, wherein the first interferometer and the second interferometer are laterally disposed with respect to each other, and wherein the transition section has a width that is at least twice a distance between the first interferometer and the second interferometer.

Preferably, the measuring reflector may be comprised of a plurality of inverted T-shaped planar mirrors that are joined together along the horizontal direction, each adjacent two of the plurality of inverted T-shaped planar mirrors being oriented inversely with respect to each other, each of the plurality of inverted T-shaped planar mirrors including a base and a protrusion, wherein the first interferometer and the second interferometer are vertically stacked with one above the other, and wherein the transition sections are defined by bases of adjacent ones of the plurality of planar mirrors.

Preferably, the laser interferometer may be implemented as a uniaxial interferometer or a biaxial interferometer.

Preferably, the measuring reflector may be mounted on a side face of the workpiece stage and is perpendicular to a horizontal plane, and wherein the light beams emanated from the laser interferometer are vertically incident on a surface of the measuring reflector in a direction parallel to a normal of the measuring reflector and follow original paths back.

Preferably, the measuring reflector may be mounted on the side face of the workpiece stage and is inclined at an angle of 135° with respect to the side face of the workpiece stage, wherein the laser interferometer further includes a second planar mirror disposed above the workpiece stage and the second planar mirror is oriented parallel to a workpiece-supporting surface of the workpiece stage, and wherein the light beams emanated from the laser interferometer are incident on a surface of the measuring reflector at an angle of 45° with respect to a normal thereof and reflected thereby to the second planar mirror and then follow original paths back.

The present invention also provides a control method for the interferometer measuring device as defined above, in which during incidence of the light beams from the first interferometer and the second interferometer on the transition sections, the first interferometer and the second interferometer alternately provide current positional information to the workpiece stage and alternately update a zero reference of one of the first interferometer and the second interferometer with the positional information from the other one of the first interferometer and the second interferometer in order to correct differences in surface nonlinearity between corresponding adjacent two of the plurality of planar mirrors.

Preferably, alternately updating a zero reference of one of the first interferometer and the second interferometer with the positional information from the other one of the first interferometer and the second interferometer may include the steps of:

when the light beams from the first interferometer and the second interferometer are incident on the corresponding transition section, defining one of the first interferometer and the second interferometer that emanates the light beam that first passes across a joint between the corresponding adjacent two of the plurality of planar mirrors as an ineffective interferometer and the other one as an effective interferometer;

providing, by the effective interferometer, the current positional information obtained thereby to the workpiece stage and to the ineffective interferometer; and calculating, by the ineffective interferometer, an updated zero reference of the ineffective interferometer based on the positional information from the effective interferometer and the differences in surface nonlinearity between the corresponding adjacent two of the plurality of planar mirrors.

Preferably, alternately updating a zero reference of one of the first interferometer and the second interferometer with the positional information from the other one of the first interferometer and the second interferometer may further include the step of, after the light beam from the effective interferometer has also passed across the joint between the corresponding adjacent two of the plurality of planar mirrors, updating a zero reference of the effective interferometer with the updated zero reference.

Preferably, the differences in surface nonlinearity may be differences between optical path lengths of the first and second interferometers at the corresponding transition section.

Compared with the prior art, the present invention provides an interferometer measuring device and a method for control thereof. The interferometer measuring device includes a workpiece stage, a laser interferometer and a measuring reflector mounted on the workpiece stage. The measuring reflector is an assembly of a plurality of planar mirrors that are joined together along a horizontal direction. The laser interferometer includes a first interferometer and a second interferometer. During advancement of the workpiece stage, upon incidence of light beams emanated from the first interferometer and the second interferometer on the transition sections, the first interferometer and the second interferometer alternately provide positional information to the workpiece stage. For each of the transition sections, the light beams from the first interferometer and the second interferometer are incident on the respective corresponding adjacent two of the planar mirrors that define the transition section. According to the present invention, the horizontal measurement range for the workpiece stage is extended through use of the plurality of planar mirrors that are joined together as well as through alternating zero-reference updating of the two interferometers.

BRIEF DESCRIPTION OF THE DRAWINGS

In FIG. 1: 1-workpiece stage; 2-elongated reflector; 3-laser interferometer.

In FIGS. 2 to 9: 10-workpiece stage; 20-laser interferometer; 21-first interferometer; 22-second interferometer; 30-first elongated reflector; 31-planar mirrors; 32-transition section; 33-zeroing point; 40-45-degree planar mirror; 50-second planar mirror.

DETAILED DESCRIPTION

In order for the above objectives, features, and advantages of the present invention to be more apparent and readily understood, several specific embodiments thereof will be described in detail below with reference to the accompanying drawings. It is noted that the figures are provided in a very simplified form not necessarily presented to scale, with the only purpose of facilitating convenience and clarity in explaining the embodiments.

Embodiment 1

Figure 1:
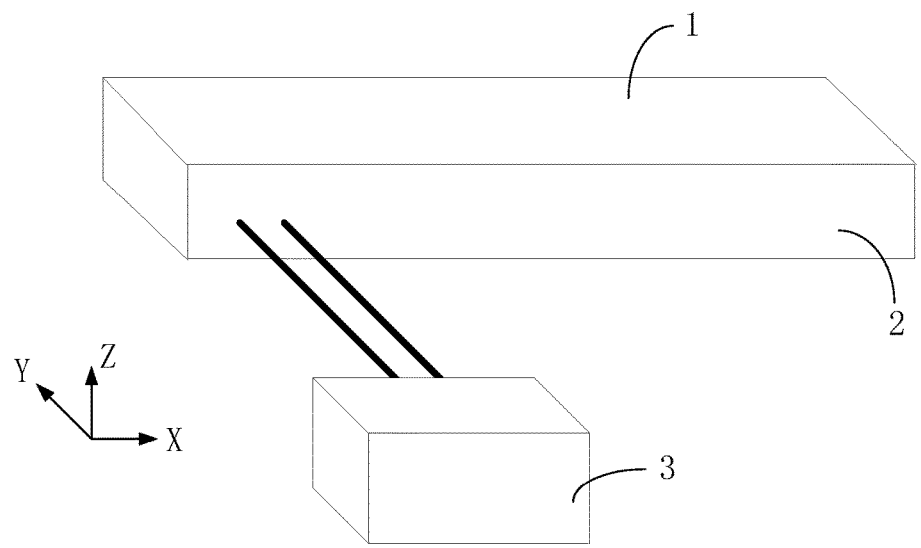
FIG. 1 is a structural schematic of a conventional interferometer measuring device.
Figure 2:
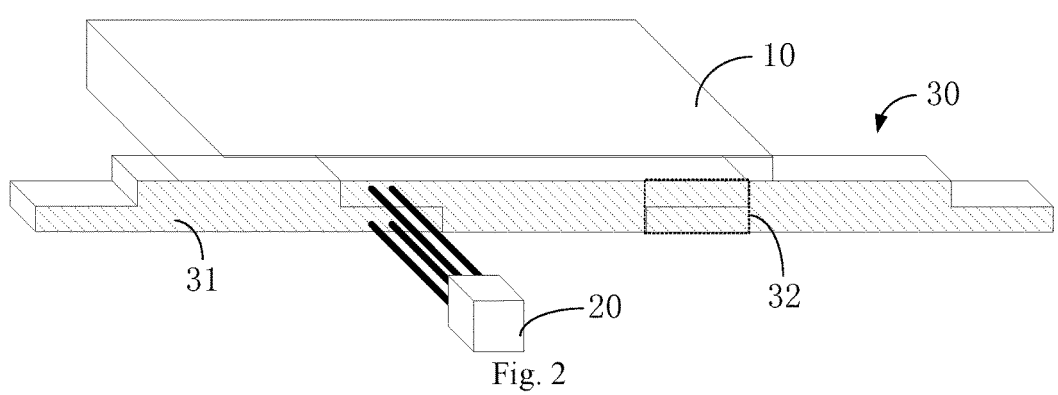
FIG. 2 is a structural schematic of an interferometer measuring device according to a first embodiment of the present invention.
Figure 3:
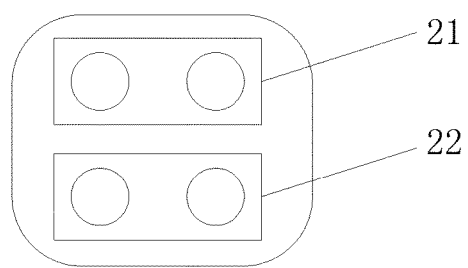
FIG. 3 is a structural schematic of a laser interferometer in the interferometer measuring device according to the first embodiment of the present invention.

An interferometer measuring device provided in the present invention includes, as shown in FIGS. 2 and 3, a workpiece stage 10, a laser interferometer 20 and a first elongated reflector 30 mounted on a side face of the workpiece stage 10. The first elongated reflector 30 is comprised of a plurality of planar mirrors 31 that are joined together along a horizontal direction so that each adjacent two of the planar mirrors 31 define a transition section 32 at a joint between them. The laser interferometer 20 includes a first interferometer 21 and a second interferometer 22. During movement of the workpiece stage 10, when the laser interferometer 20 directly faces one of the transition sections 32, light beams from the first and second interferometers 21, 22 are incident on the respective two of the planar mirrors 31 that define the transition section 32. Therefore, at each of the transition sections 32, the light beams from the first and second interferometers 21, 22 are incident on respective corresponding two of the planar mirrors 31. In this way, the present invention enables an extended horizontal measurement range for the workpiece stage 10 through use of the plurality of planar mirrors 31 that are joined together as well as through alternating zero-reference updating of the two interferometers.

With continued reference to FIGS. 2 and 3, in this embodiment, the first elongated reflector 30 is comprised of a plurality of inverted T-shaped planar mirrors 31 joined together along the horizontal direction, with each adjacent two of the planar mirrors 31 being inverted with respect to each other. That is, one of the two adjacent planar mirrors 31 assumes the shape of the letter "T" inverted, with the other one of the two adjacent planar mirrors 31 assumes the shape of the letter "T". The first interferometer 21 and the second interferometer 22 are vertically stacked with one above the other.

If a single laser interferometer is used for such an assembly of the planar mirrors, as a gap may present between adjacent two of the planar mirrors and may cause a joint error, a zero reference of the single laser interferometer may become ineffective, leading to impaired measurement accuracy, when it scans across the joint. In contrast, in this embodiment, the problem of possible joint errors can be circumvented, as the light beams from the two interferometers are incident on the respective two of the planar mirrors 31 at the transition section 32.

Figure 4:
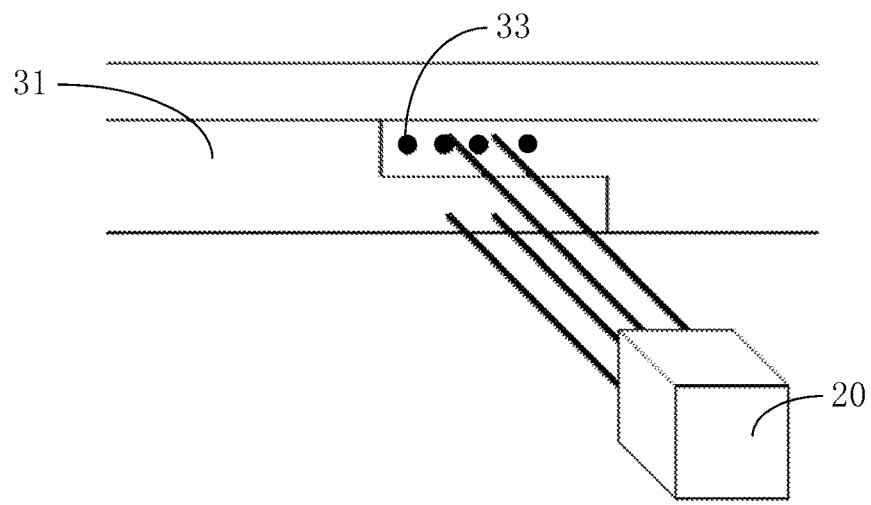
FIG. 4 schematically illustrates an arrangement of zeroing points on a transition section of the interferometer measuring device according to the first embodiment of the present invention.

Preferably, with reference to FIG. 4, each of the inverted T-shaped planar mirrors 31 includes a base and a protrusion. In this embodiment, each of the transition sections 32 is constructed of a vertical stack of the bases of the corresponding two adjacent ones of the inverted T-shaped planar mirrors 31. Several zeroing points 33 are provided on an edge of one of the bases for indicating an ongoing interaction between the laser interferometer 20 and the transition section 32. While only four zeroing points 33 are illustrated schematically in FIG. 4, the present invention is not so limited because the number of the zeroing points 33 may be determined by one or more of parameters including a length of the transition section 32, a sampling frequency of the interferometer and a travelling speed of the workpiece stage 10.

Preferably, the laser interferometer 20 may either be a uniaxial interferometer capable of measuring unidirectional translation of the workpiece stage 10 or a biaxial interferometer capable of measuring unidirectional translation and rotation of the workpiece stage 10.

Preferably, the laser interferometer 20 may be fixed to a main frame of a photolithography machine. A measurement direction of the laser interferometer 20 is in coincidence with a propagation direction of the light beams emanated from the laser interferometer 20 and is parallel to a normal of the first elongated reflector 30 so that the light beams from the laser interferometer 20 are vertically incident on the first elongated reflector 30.

The present invention also provides a method for controlling the interferometer measuring device as defined above. During scanning of the light beams from the first and second interferometers 21, 22 across the transition sections 32, the first and second interferometers 21, 22 alternately provide information of the current position and, with the measured positional information, update the zero reference of the other interferometer and correct differences in surface nonlinearity between the adjacent planar mirrors.

Preferably, the differences in surface nonlinearity are differences between optical path lengths of the first and second interferometers 21, 22. Specifically, during the scanning of the first and second interferometers across the transition sections 32 as a result of a transverse travel of the workpiece stage 10, optical path lengths lui of the first interferometer 21 and the optical path lengths ldi of the second interferometer 22, at different positions, may be recorded and the differences in surface nonlinearity between the adjacent planar mirrors 31 may be calculated as delta_1=lui−ldi.

It will be appreciated that translation of the first elongated reflector 30 mounted on the workpiece stage 10 relative to the laser interferometer 20 is equivalent to scanning of the light beams from the laser interferometer 20 across the first elongated reflector 30. During scanning of the light beams across one of the transition sections 32, the one of the first and second interferometers 21, 22 that emanates the one of the light beams that first scans across the joint between the corresponding adjacent two of the planar mirrors 31 is defined as an ineffective interferometer and the other as an effective interferometer. The effective interferometer provides information of the current position to the workpiece stage 10, while the ineffective interferometer undergoes a zero-reference correction effected based both on the positional information provided by the effective interferometer and on differences in surface nonlinearity delta_1 between the adjacent two planar mirrors 31.

Preferably, the zero-reference correction of the ineffective interferometer includes: selecting, on the transition section 32, several zeroing points 33 arranged along a lengthwise direction of the first elongated reflector 30; calculating zeroing offsets h01, h02, h03 . . . of the ineffective interferometer at the zeroing points 33 based on the positional information obtained by the effective interferometer and the differences in surface nonlinearity at the transition section 32 between the adjacent two planar mirrors 31; discarding those of the zeroing offsets with extreme values (i.e., those most and least deviated from an average of all the zeroing offsets); and taking the mean of the remaining ones of the zeroing offsets as an updated zero reference for the ineffective interferometer.

A process for controlling the interferometer measuring device of the present invention will be described below with reference to FIGS. 5a to 5d.

Figure 5A:
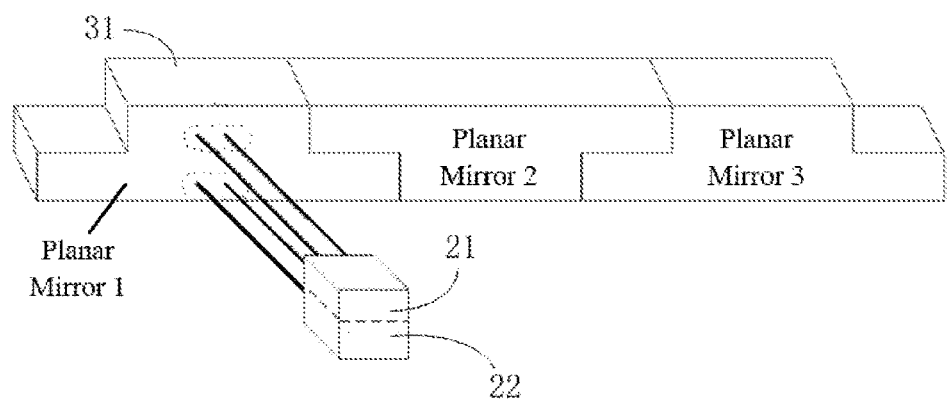
FIGS. 5a to 5d schematically show a method for controlling the interferometer measuring device according to the first embodiment of the present invention.

As shown in FIG. 5a, light beams emitted from the upper first interferometer 21 and the lower second interferometer 22 are both incident on one of the planar mirrors 31 (Planar Mirror 1 in the figures). At this point, the second interferometer 22 is served to provide the positional information.

Figure 5B:
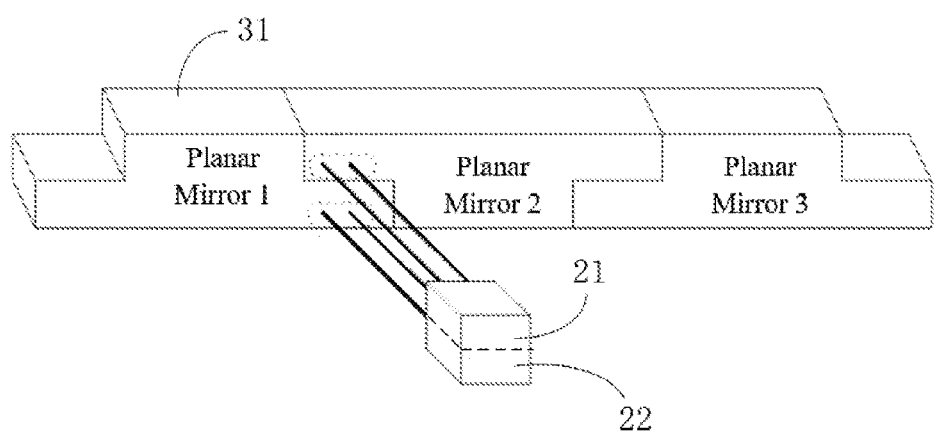

As shown in FIG. 5b, when the laser interferometer 20 advances to directly face the immediately downstream transition section 32, the light beam from the upper first interferometer 21 is incident on the next planar mirror 31 (Planar Mirror 2 in the figures), with the light beam from the lower second interferometer 22 still being incident on the previous planar mirror 31 (Planar Mirror 1 in the figures). At this point, as the first interferometer 21 has scanned across the joint between the two neighboring planar mirrors 31, the first interferometer 21 becomes ineffective and its reading is discarded. As a result, the second interferometer 22 continues providing the positional information, and the zero reference for the first interferometer 21 is updated with the positional information provided by the second interferometer 22.

Figure 5C:
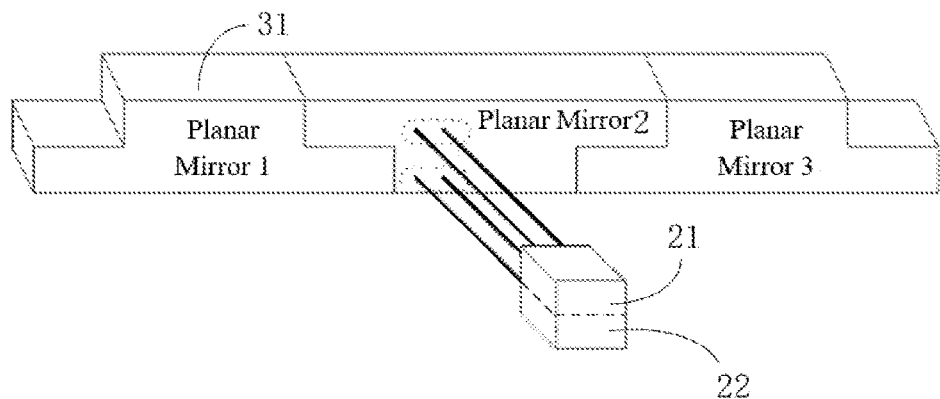

As shown in FIG. 5c, when the lower second interferometer 22 further advances to face the next planar mirror 31 (Planar Mirror 2 in the figures), the reading of the second interferometer 22 is discarded, and the updated first interferometer 21 starts to provide the positional information to the workpiece stage 10.

Figure 5D:
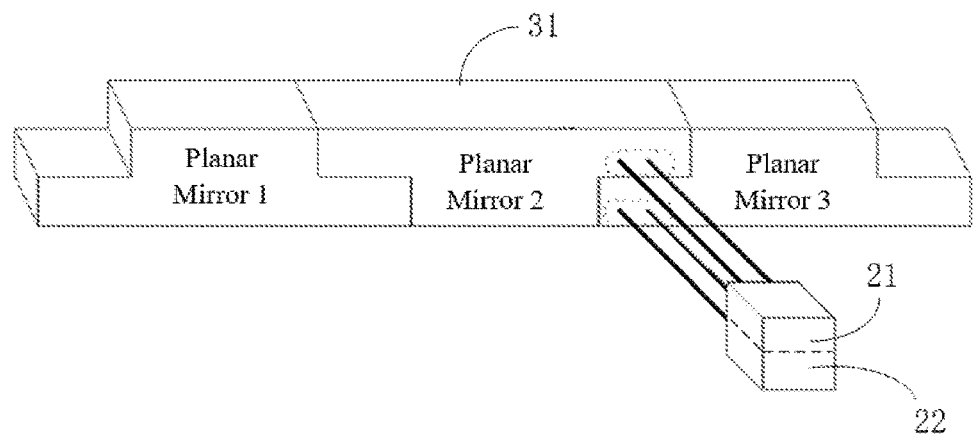

As shown in FIG. 5d, when the laser interferometer 20 further advances to face the next transition section 32, the light beam from the upper first interferometer 21 is still incident on the second planar mirror 31 (Planar Mirror 2 in the figures), while the light beam from the lower second interferometer 22 is incident on the still next planar mirror 31 (Planar Mirror 3 in the figures). At this point, the first interferometer 21 continues providing the positional information, based on which the zero reference of the second interferometer 22 is updated. When the first interferometer 21 advances to face Planar Mirror 3 in the figures, the updated second interferometer 22 starts to provide positional information to the workpiece stage 10.

These steps are iterated until the measurement of the first elongated reflector 30 is completed.

With this method, the problems of an excessively long elongated reflector that may add processing difficulties and raise the manufacturing cost as well as of joint errors occurring during the assembly of the planar mirrors 31 that may impair the measurement accuracy are addressed.

Embodiment 2

Figure 6:
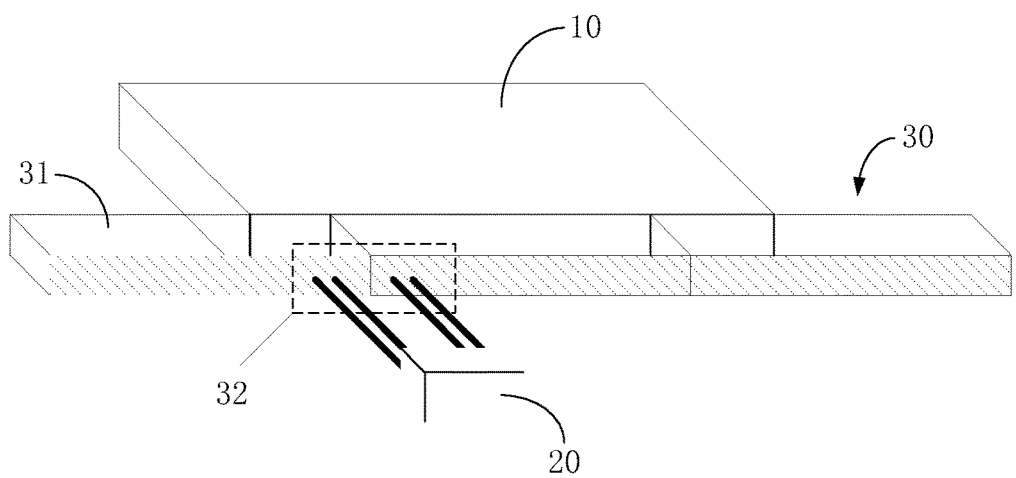
FIG. 6 is a structural schematic of an interferometer measuring device according to a second embodiment of the present invention.
Figure 7:
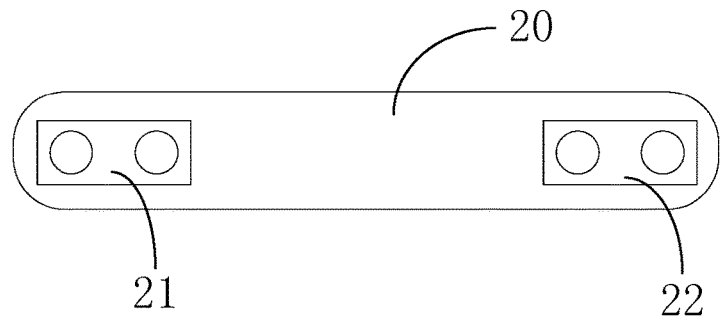
FIG. 7 is a structural schematic of a laser interferometer in the interferometer measuring device according to the second embodiment of the present invention.

Preferably, with reference to FIGS. 6 and 7, the first elongated reflector 30 may alternatively be comprised of a plurality of rectangular planar mirrors 31 that are put together along the horizontal direction, with the first and second interferometers 21, 22 being disposed laterally to each other. In addition, the transition sections 32 may be defined to have a width that is at least twice the distance between the first and second interferometers 21, 22. In this embodiment, with the advancement of the workpiece stage 10, the light beam from the second interferometer 22 is first incident on the next planar mirror 31. At this point, the first interferometer 21 provides the positional information, and the zero reference of the second interferometer 22 is updated based thereon. When the first and second interferometers 21, 22 further advance to both face the next planar mirror 31, the second interferometer 22 starts to provides the positional information, and the zero reference of the first interferometer 21 is updated based thereon. These steps are iterated until the measurement of the first elongated reflector 30 is completed.

A process for controlling the interferometer measuring device in accordance with this embodiment will be described below with reference to FIGS. 8a to 8c.

Figure 8A:
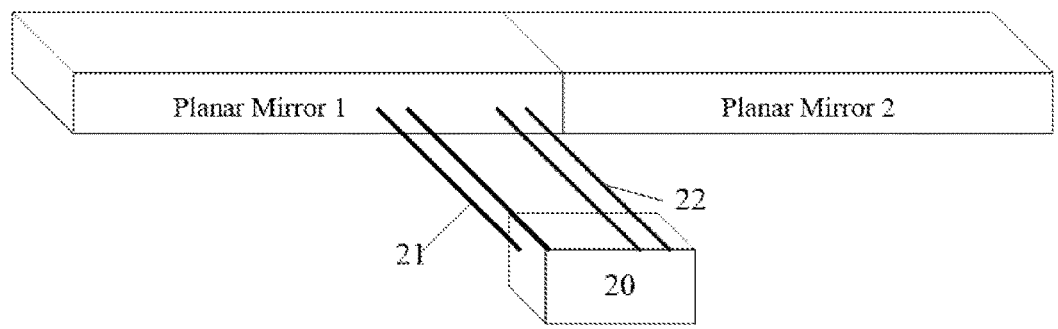
FIGS. 8a to 8c schematically show a method for controlling the interferometer measuring device according to the second embodiment of the present invention.

As shown in FIG. 8a, the light beams from the first interferometer 21 (the left one in the figures) and the second interferometer 22 (the right one in the figures) are both incident on one of the planar mirrors 31 (Planar Mirror 1 in the figures). At this point, the first interferometer 21 is served to provide the positional information.

Figure 8B:
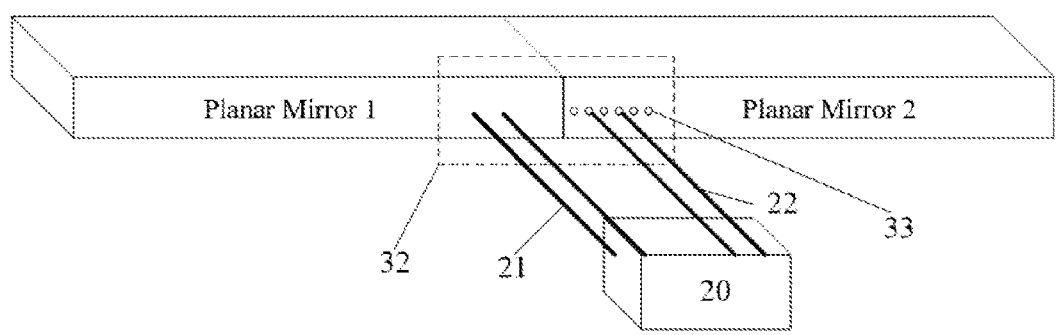

As shown in FIG. 8b, when the light beams from the first interferometer 21 and the second interferometer 22 are both incident on the immediately downstream transition section 32, the light beam from the second interferometer 22 is incident on the next planar mirror 31 (Planar Mirror 2 in the figures), with the light beam from the first interferometer 21 still being incident on the previous planar mirror 31 (Planar Mirror 1 in the figures). At this point, the second interferometer 22 becomes ineffective and, upon incidence of the light beam from the second interferometer 22 on zeroing points 33 on the planar mirror 31 (Planar Mirror 2 in the figures), the zero reference of the second interferometer 22 is updated based both on the positional information provided by the first interferometer 21 and on differences in surface nonlinearity between the adjacent two planar mirrors 31 (Planar Mirrors 1 and 2 in the figures).

Figure 8C:
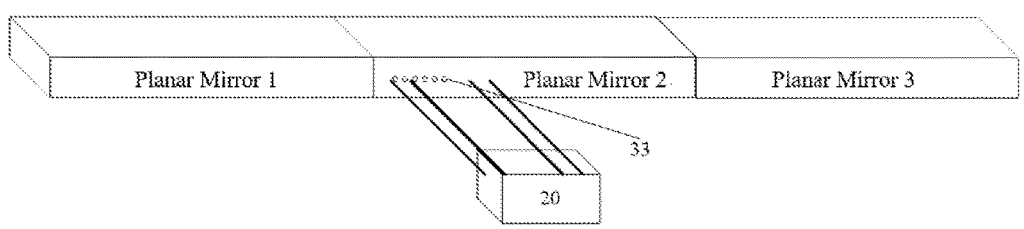

As shown in FIG. 8c, when the first interferometer 21 further advances to also face the next planar mirrors 31 (Planar Mirror 2 in the figures), the reading of the first interferometer 21 is discarded, and the updated second interferometer 22 starts to provides the positional information to the workpiece stage 10. At the same time, the zero reference of the first interferometer 21 is updated based on the positional information provided by the second interferometer 22. When the second interferometer 22 further advances to face Planar Mirror 3 in the figures, the updated first interferometer 21 starts to provide the positional information to the workpiece stage 10 instead.

These steps are iterated until the measurement of the first elongated reflector 30 is completed.

Embodiment 3

Figure 9:
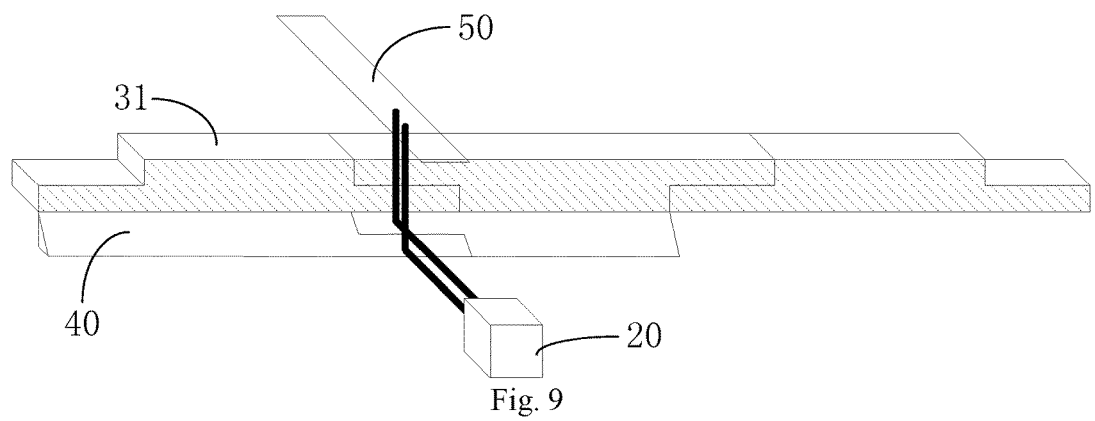
FIG. 9 is a structural schematic of an interferometer measuring device according to a third embodiment of the present invention.

Preferably, with reference to FIG. 9, this embodiment differs from Embodiment 1 in that the interferometer measuring device further includes 45-degree planar mirrors 40 and a second planar mirror 50. The 45-degree planar minors 40 are disposed under the first elongated reflector 30 and are oriented to form an angle of 135° with respect to the first elongated reflector 30 and an angle of 45° with respect to the second planar mirror 50. Part of light emanated from the laser interferometer 20 is redirected by the 45-degree planar mirrors 40 to the second planar mirror 50 and then follows the original path back. The 45-degree planar mirrors 40 are assembled in the same way as the planar mirrors 31 of Embodiment 1 in order to extend the measurement range. According to this embodiment, in addition to the horizontal degree of freedom, the workpiece stage 10 can additionally be measured in its vertical degree of freedom.

Embodiment 4

This embodiment differs from Embodiment 1 in that the 45-degree planar mirrors 40 are assembled in the same way as the planar mirrors of Embodiment 2 in order to extend the measurement range.

To sum up, the present invention provides an interferometer measuring device and a method for control thereof. The interferometer measuring device includes a workpiece stage 10, a laser interferometer 20 and a measuring reflector (i.e., the first elongated reflector 30 and/or 45-degree planar mirrors 40) mounted on a side face of the workpiece stage 10. The measuring reflector is an assembly of a plurality of planar mirrors 31 that are joined together along a horizontal direction, while the laser interferometer 20 includes a first interferometer 21 and a second interferometer 22. During advancement of the workpiece stage 10, whenever the laser interferometer 20 directly faces any of transition sections 32, light beams from the first and second interferometers 21, 22 are incident on the two of the planar mirrors 31 that form the transition section 32. Additionally, the first and second interferometers 21, 22 alternately provide positional information to the workpiece stage 10. According to the present invention, the horizontal measurement range for the workpiece stage 10 is extended through use of the plurality of planar mirrors 31 that are joined together as well as through alternating zero-reference updating of the two interferometers.

It is apparent that those skilled in the art can make various modifications and variations to the present invention without departing from the spirit and scope thereof Accordingly, the invention is intended to embrace all such modifications and variations if they fall within the scope of the appended claims and equivalents thereof.

What is claimed is:

1. An interferometer measuring device, comprising a workpiece stage, a laser interferometer and a measuring reflector mounted on the workpiece stage, wherein the measuring reflector is comprised of a plurality of planar mirrors that are joined together along a horizontal direction, and wherein the laser interferometer comprises a first interferometer and a second interferometer, which are configured such that, during a movement of the workpiece stage with respect to the laser interferometer along the horizontal direction, when light beams emanated from the first interferometer and the second interferometer are incident on a transition section defined by corresponding adjacent two of the plurality of planar mirrors, the light beam emanated from the first interferometer is incident on one of the adjacent two planar mirrors with the light beam emanated from the second interferometer being incident on the other one of the adjacent two planar mirrors, and the first interferometer and the second interferometer alternately provide positional information to the workpiece stage, wherein the measuring reflector is comprised of a plurality of inverted T-shaped planar mirrors that are joined together along the horizontal direction, each adjacent two of the plurality of inverted T-shaped planar mirrors being oriented inversely with respect to each other, each of the plurality of inverted T-shaped planar mirrors comprising a base and a protrusion, wherein the first interferometer and the second interferometer are vertically stacked with one above the other, and wherein the transition sections are defined by bases of adjacent ones of the plurality of planar mirrors.

2. The interferometer measuring device of claim 1, wherein the laser interferometer is implemented as a uniaxial interferometer or a biaxial interferometer.

3. The interferometer measuring device of claim 1, wherein the measuring reflector is mounted on a side face of the workpiece stage and is perpendicular to a horizontal plane, and wherein the light beams emanated from the laser interferometer are vertically incident on a surface of the measuring reflector in a direction parallel to a normal of the measuring reflector and follow original paths back.

4. The interferometer measuring device of claim 1, wherein the measuring reflector is mounted on a side face of the workpiece stage and is inclined at an angle of 135° with respect to the side face of the workpiece stage, wherein the laser interferometer further comprises a second planar mirror disposed above the workpiece stage and the second planar mirror is oriented parallel to a workpiece-supporting surface of the workpiece stage, and wherein the light beams emanated from the laser interferometer are incident on a surface of the measuring reflector at an angle of 45° with respect to a normal thereof and reflected thereby to the second planar mirror and then follow original paths back.

5. A control method for the interferometer measuring device as defined in claim 1, wherein during incidence of the light beams from the first interferometer and the second interferometer on a corresponding transition section, the first interferometer and the second interferometer alternately provide current positional information to the workpiece stage and alternately update a zero reference of one of the first interferometer and the second interferometer with the positional information from the other one of the first interferometer and the second interferometer in order to correct differences in surface nonlinearity between corresponding adjacent two of the plurality of planar mirrors.

6. The control method of claim 5, wherein alternately updating a zero reference of one of the first interferometer and the second interferometer with the positional information from the other one of the first interferometer and the second interferometer comprises the steps of:
when the light beams from the first interferometer and the second interferometer are incident on the corresponding transition section, defining one of the first interferometer and the second interferometer that emanates the light beam that first passes across a joint between the corresponding adjacent two of the plurality of planar mirrors as an ineffective interferometer and the other one as an effective interferometer;
providing, by the effective interferometer, the current positional information obtained thereby to the workpiece stage and to the ineffective interferometer; and
calculating, by the ineffective interferometer, an updated zero reference of the ineffective interferometer based on the positional information from the effective interferometer and the differences in surface nonlinearity between the corresponding adjacent two of the plurality of planar mirrors.

7. The control method of claim 6, wherein alternately updating a zero reference of one of the first interferometer and the second interferometer with the positional information from the other one of the first interferometer and the second interferometer further comprises the step of, after the light beam from the effective interferometer has also passed across the joint between the corresponding adjacent two of the plurality of planar mirrors, updating a zero reference of the effective interferometer with the updated zero reference.

8. The control method of claim 5, wherein the differences in surface nonlinearity are differences between optical path lengths of the first and second interferometers at the corresponding transition section.

* * * * *